United States Patent [19]

Caldwell

[11] 4,251,300
[45] Feb. 17, 1981

[54] METHOD FOR FORMING SHAPED BURIED LAYERS IN SEMICONDUCTOR DEVICES UTILIZING ETCHING, EPITAXIAL DEPOSITION AND OXIDE FORMATION

[75] Inventor: Robert E. Caldwell, San Jose, Calif.

[73] Assignee: Fairchild Camera and Instrument Corporation, Mountain View, Calif.

[21] Appl. No.: 39,070

[22] Filed: May 14, 1979

[51] Int. Cl.³ ...................... H01L 21/20; H01L 21/76
[52] U.S. Cl. ................................. 148/175; 29/576 E; 29/576 W; 29/578; 29/580; 148/187; 156/647; 156/649; 156/657; 156/662; 357/20; 357/50; 357/56
[58] Field of Search ............. 148/175, 187; 29/576 E, 29/576 W, 578, 580; 156/647, 649, 653, 657, 662; 357/20, 49, 50, 55, 56

[56] References Cited

U.S. PATENT DOCUMENTS

| 3,370,995 | 2/1968 | Lowery et al. ................... 148/175 |
| 3,456,169 | 7/1969 | Klein ............................... 148/175 X |
| 3,648,125 | 3/1972 | Peltzer ............................. 357/49 |
| 3,728,166 | 4/1973 | Bardell et al. ................... 148/175 |
| 3,740,276 | 6/1973 | Bean ................................ 29/580 X |
| 3,764,409 | 10/1973 | Nomura et al. ................. 148/175 |
| 4,056,413 | 11/1977 | Yoshimura ...................... 148/175 |
| 4,089,021 | 5/1978 | Sato et al. ....................... 156/647 X |
| 4,101,350 | 7/1978 | Possley et al. .................. 148/187 X |
| 4,143,455 | 3/1979 | Schwabe et al. ............... 29/571 |

OTHER PUBLICATIONS

Agusta et al., "Monolithic Integrated . . . Base Regions", I.B.M. Tech. Discl. Bull., vol. 9, No. 5, Oct., 1966, pp. 546–547.
Wu, L. L., "Doped P & N Pockets for Complementary FETS".
Ibid., vol. 15, No. 7, Dec., 1972, p. 2279.

Primary Examiner—L. Dewayne Rutledge
Assistant Examiner—W. G. Saba
Attorney, Agent, or Firm—Paul J. Winters; Ronald J. Meetin; Michael J. Pollock

[57] ABSTRACT

A method for forming a shaped buried layer in a semiconductor structure includes the steps of removing a portion of semiconductor material from adjacent the surface of the semiconductor substrate to form an indentation, introducing a dopant into the surface of the indentation to form regions of impurity in the semiconductor substrate, forming a region of epitaxial material on the surface of the indentation, and forming regions of insulating material to surround the epitaxial material.

13 Claims, 8 Drawing Figures

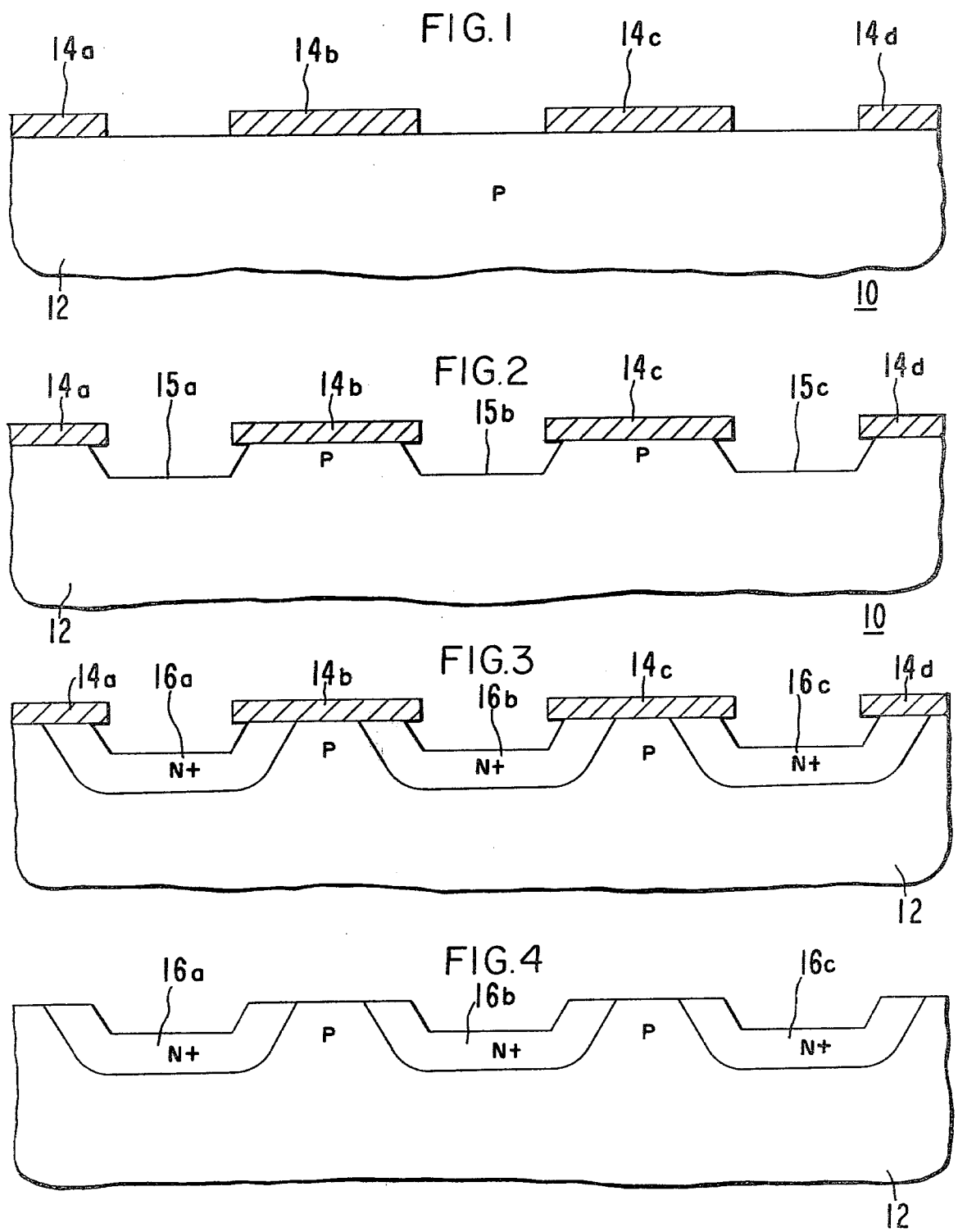

METHOD FOR FORMING SHAPED BURIED LAYERS IN SEMICONDUCTOR DEVICES UTILIZING ETCHING, EPITAXIAL DEPOSITION AND OXIDE FORMATION

BACKGROUND OF THE INVENTION

1. Field of the Invention

This invention relates to semiconductor structures, and in particular to oxide-isolated integrated circuit structures having specially shaped buried layers.

2. Description of the Prior Art

Oxide-isolated semiconductor structures and integrated circuits are well known in the art. See, e.g., U.S. Pat. No. 3,648,125 entitled "METHOD OF FABRICATING INTEGRATED CIRCUITS WITH OXIDIZED ISOLATION AND THE RESULTING STRUCTURE" issued to Douglas L. Peltzer. Also well known are techniques for forming buried layers in oxide-isolated integrated circuits. For example, FIGS. 10a, 10b and 10c of the above-cited patent depict a typical prior-art processing sequence for fabricating a buried layer 43a in a semiconductor substrate 41, and then forming oxidized isolation regions.

A typical process for manufacturing such a prior art oxide-isolated integrated circuit structure includes diffusing n-type impurity into the p-type silicon substrate to form the buried layer using a silicon dioxide layer as a diffusion mask. The silicon dioxide is then removed and an epitaxial layer of silicon grown on the surface of the substrate. The upper surface of the epitaxial layer and the upper surface of the buried layer are each essentially flat, although displaced from one another by approximately the thickness of the epitaxial layer. A silicon nitride layer is then formed and partially removed to provide a mask for etching the epitaxial layer where regions of oxide isolation are desired. The epitaxial layer is etched and then oxidized down to the buried layer to electrically isolate pockets in the epitaxial layer. Active and/or passive electronic components may be formed in these pockets.

Unfortunately, prior-art structures such as the one described suffer from several disadvantages. First, the epitaxial layer must be etched to such a deep depth to obtain effective oxide isolation that the upper surface to the integrated circuit structure becomes significantly non-planar. It is well known in the semiconductor manufacturing arts that non-planar surfaces present numerous processing difficulties; for example, it is difficult to traverse such non-planar surfaces with thin reliable metal connections. Another disadvantage of such prior-art structures is that the mask for etching the epitaxial layer to form the regions of oxide isolation must be carefully aligned with respect to the buried layer to obtain acceptable electrical isolation.

Accordingly, it is an object of this invention to create a more uniformly planar integrated circuit structure, to improve the electrical isolation characteristics of oxidized insulation, and to increase the alignment tolerances between the mask for diffusing the buried layer and the mask for etching the silicon for the oxidized isolation regions.

SUMMARY OF THE INVENTION

According to one embodiment of the invention, a method for forming a shaped buried layer in a semiconductor structure includes the steps of removing at least one portion of semiconductor material from adjacent the upper surface of a semiconductor substrate to form an indentation having a surface. A desired impurity dopant, typically of opposite conductivity to the substrate, is then introduced into the substrate through the surface of the indentation to form a doped buried layer region in the substrate. A layer of epitaxial material is formed across the surface of the semiconductor substrate and the surface of the indentation, and is then removed from the surface of the substrate. Finally, the surface of the substrate is oxidized to create an oxidized isolation region surrounding the region of epitaxial material.

Typically, the semiconductor substrate is silicon, the epitaxial material is epitaxial silicon, and the insulating material is silicon dioxide. The indentations are usually formed by etching the substrate after forming a protective mask. Similarly, the epitaxial material is removed by forming a protective mask over the desired portions and then chemically etching the undesired portions.

The process of this invention results in a structure which includes a semiconductor substrate having at least one indentation bordering a region of impurity in the substrate, a region of epitaxial material formed on the surface of the indentation, and regions of insulating material formed on the surface of the substrate surrounding the indentation.

The resulting structure has a smaller net step height between the upper surfaces of the oxidized isolation regions and the epitaxial regions than prior art structures. This improves the accuracy of subsequent masking steps, during which additional active and/or passive devices may be formed in the epitaxial silicon. Further, the process of this invention increases the alignment tolerances between the mask for etching the epitaxial silicon and the mask for doping the buried layer.

BRIEF DESCRIPTION OF THE DRAWINGS

FIG. 1 is a cross-sectional view of a hypothetical semiconductor substrate showing regions of masking material formed thereon;

FIG. 2 is a further cross-sectional view showing the substrate after indentations have been etched into it.

FIG. 3 is a further cross-sectional view showing the appearance of the substrate after impurities have been diffused into the substrate through the exposed surface of the indentation;

FIG. 4 is a further cross-sectional view showing the appearance of the structure after removal of the masking layers;

DESCRIPTION OF THE PREFERRED EMBODIMENT

Figure 5:
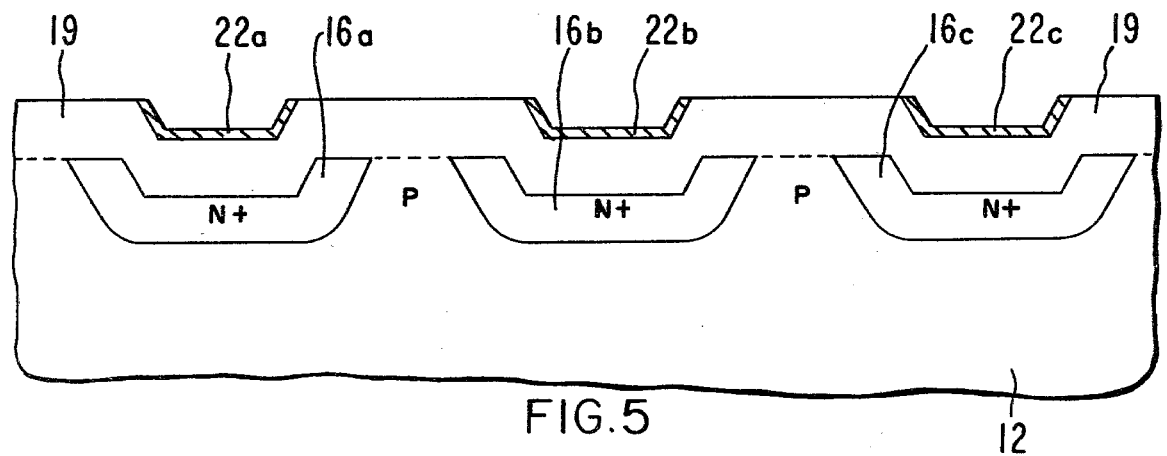
FIG. 5 is a further cross-sectional view after formation of the layer of epitaxial material and regions of masking material.

FIG. 1 shows a cross-sectional view of a semiconductor substrate 12 and regions of masking material 14

(illustrated as regions 14a, 14b, 14c, and 14d). In the preferred embodiment, substrate 12 will be off-orientation [100] silicon, and masking layer 14 will be 8000 Angstroms thick silicon dioxide which has been selectively masked and removed from the surface of the substrate using well-known semiconductor fabrication techniques. As will be shown, masking layer 14 is removed wherever buried layers are desired in the substrate 12.

As shown in FIG. 2, the silicon substrate 12 is chemically etched to produce indentations 15 (illustrated as indentations 15a, 15b, and 15c, respectively) in the surface thereof. Silicon 12 may be selectively removed in any well-known manner; however, chemical etching has been found suitable. One such chemical etchant comprises: a bulk solution of 11 grams iodine crystals in 2000 milliliters of acetic acid, from which 5000 milliliters are mixed with 2500 milliliters of nitric acid and 200 milliliters of hydrofluoric acid. This etchant is applied to the exposed portions of the substrate for 30–90 seconds at a temperature of 25° C. to achieve an etch depth of between 3000 and 9000 Angstroms. Silicon 12 is off-orientation [100] silicon because it has been found that no pattern shift occurs in epitaxial layers formed on this substrate. When off-orientation [100] silicon is used, the etching process will create an indentation having sloped sides as shown in FIG. 2.

Then, as shown in FIG. 3, a desired impurity is diffused or otherwise introduced into the substrate, using masking regions 14 to protect the substrate 12. In the preferred embodiment, the impurity is antimony which is applied to surface of the indentations 15 by deposition from gas and is then diffused into the surface by heating the structure to a temperature of 1245° C. for 70 minutes. This creates buried layer regions 16 (illustrated as regions 16a, 16b, and 16c, respectively) which are approximately 20,000 Angstroms thick.

Next, the silicon dioxide masks 14 are removed using hydrofluoric acid etch applied to the semiconductor substrate surface for two minutes at a temperature of 25° C. The appearance of the structure after removal of mask 14 is shown in FIG. 4.

A layer of epitaxial silicon 19 is then formed across the entire surface of the substrate, including the indentations 15 and the exposed ends of each buried layer region 16. Epitaxial silicon 19 may be formed using any well-known procedure; however, in the preferred embodiment, the epitaxial layer 19 is formed by deposition from dichlorosilane doped with diborane or phosphine, in an AMC barrel reactor, and is 12,000 to 17,000 Angstroms thick. Across the upper surface of epitaxial silicon 19 is formed a further masking layer 22 (illustrated as regions 22a, 22b, and 22c, respectively). Layer 22 will typically be formed across the entire upper surface of epitaxial silicon 19 and then removed, by well-known masking steps, from those regions of layer 19 where it is not desired. Typically, layer 22 will be silicon nitride, and will be selectively removed using 20:1 concentration phosphoric acid.

Figure 6:
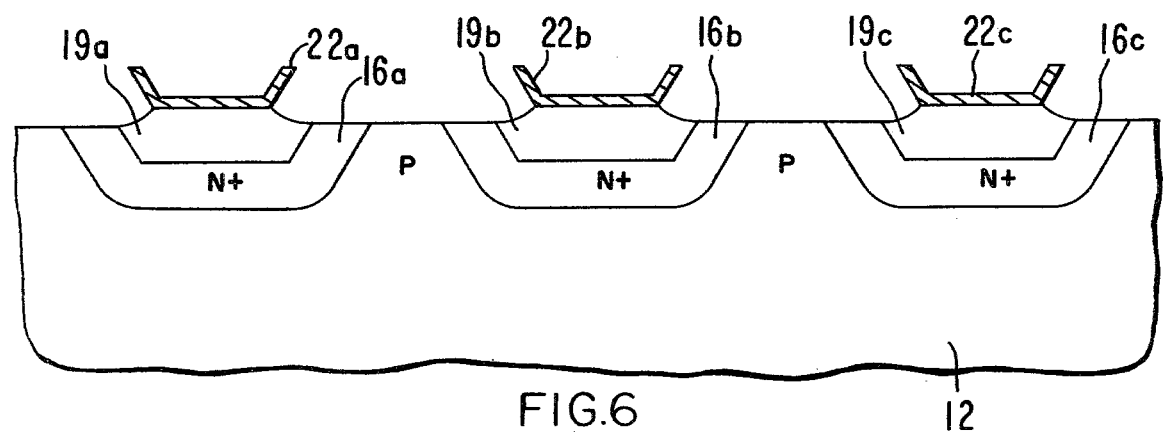
FIG. 6 is a further cross-sectional view after removal of the portions of epitaxial material disposed on the substrate.

The unprotected regions of epitaxial layer 19 are chemically etched or otherwise removed. As shown in FIG. 6, the regions (illustrated as regions 19a, 19b, 19c, respectively) of epitaxial silicon 19 disposed between the regions of masking material 22 have been chemically removed. This may be accomplished by etching the silicon 16 with the same silicon etchant described above for 120 to 160 seconds at a temperature of 25° C. The remaining regions of masking material 22 are chemically removed using the same etching technique as described above in conjunction with FIG. 5.

Figure 7:
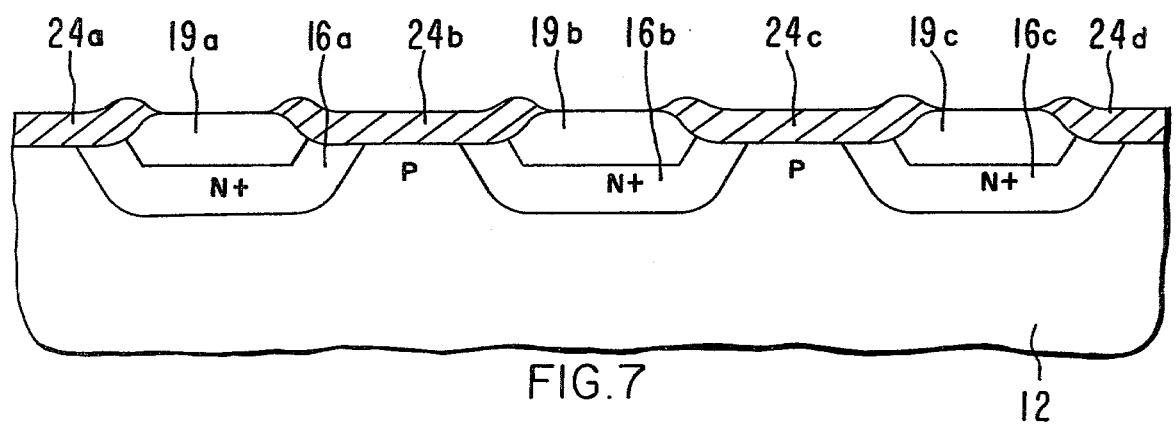
FIG. 7 is a further cross-sectional view showing the appearance of the integrated circuit structure after formation of the oxidized isolation regions between the regions of epitaxial material.

Finally, regions of oxidized isolation material 24 (illustrated as regions 24a, 24b, 24c, and 24d, respectively) are formed around the regions of epitaxial silicon 19. Isolation material 24 will typically be silicon dioxide. The thickness of oxide 24 may be controlled to result in a substantially planar upper surface on the wafer structure shown in FIG. 7. For example, in one embodiment where the epitaxial layer is 15,000 Angstroms thick, the oxidized silicon will be 9000 Angstroms thick. This thickness has been achieved by heating the wafer to 1000° C. for 180 minutes.

Figure 8:
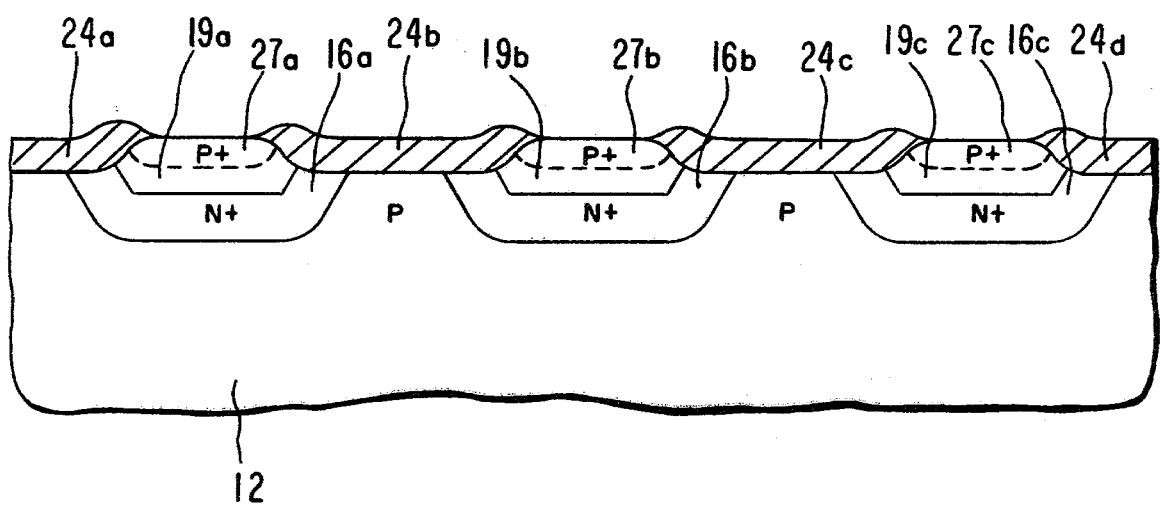
FIG. 8 is a further cross-sectional view showing the appearance of the integrated circuit structure after formation of PNP transistors in the epitaxial layer.

FIG. 8 depicts one further processing step as an example of how active devices, here transistors, may be formed in the epitaxial layer 19. As shown therein, additional well-known steps have been used to create strongly doped P regions 27 (illustrated as regions 27a, 27b, and 27c, respectively) in epitaxial regions 19. P regions 27 and 19, N region 16 and P region 12 will serve as a transistor.

The process of this invention provides several advantages over conventional prior-art processing techniques used to fabricate devices using oxidized isolation. In particular, because the epitaxial silicon is etched and oxidized in the raised regions between the buried layers, the net step height between the upper surface of the epitaxial regions 19 and the upper surface of oxidized regions 24 may be made very small. This results in a wafer which has a very uniform upper surface. The uniformity of the upper surface improves subsequent masking steps. The process also improves the electrical isolation of the oxidized isolation regions 24 because of the relatively large amount of the buried layer 16 in contact with the oxidized regions 24. This may be compared with the relatively smaller amount of the buried layer in contact with the oxidized isolation regions as shown in the prior art, for example, the Peltzer patent described above. Further, the process increases the alignment tolerances between the mask 22 used to etch the epitaxial silicon 19 and the mask used to define the buried layer. This is a result of the sloped side of the indentation made in the substrate 12. Proper alignment is important to obtain adequate isolation and reduce the gain of the substrate PNP parasitic transistor, that is, the transistor formed by the ends of p-regions 27 and 19, the ends of n-region 16, together with p-region 12.

What is claimed is:

1. A method of making at least one shaped buried layer in a semiconductor structure comprising:

removing a selected portion of semiconductor material from adjacent a first surface of a semiconductor substrate wherever a shaped buried layer is desired, the surface of each thereby created indentation being referred to as the second surface of that indentation;

introducing a first conductivity type impurity through the second surface into the semiconductor substrate to thereby form a region a region of impurity in the semiconductor substrate adjacent the second surface;

depositing epitaxial semiconductor material on all of the first surface and on the second surface of every indentation;

removing epitaxial material from all of the first surface; and forming regions of insulating material on the first surface and on portions of the epitaxial material to electrically isolate each region of epitaxial material on the second surface of every indentation from every other region of epitaxial material on the second surface of every indentation.

2. A method as in claim 1 wherein the first surface is substantially planar.

3. A method as in claim 2 wherein:
the semiconductor substrate is silicon;
the epitaxial material is silicon; and
the insulating material is silicon dioxide.

4. A method as in claim 3 wherein the substrate is off-orientation [100] silicon.

5. A method as in claim 3 wherein:
the substrate is p conductivity type; and
the first conductivity type impurity is n conductivity type.

6. A method as in claim 1 wherein the step in removing a selected portion includes:
forming a masking layer over all portions of the first surface, except the portion of the first surface overlying the at least one selected portion of semiconductor material; and
etching the portions of the first surface not overlaid by the masking layer.

7. A method as in claim 6 wherein the etching is accomplished using a chemical etchant.

8. A method as in claim 6 wherein the masking layer is formed over all of the first surface and then removed from the portion of the first surface overlying the selected portion.

9. A method as in claim 6 wherein:
the first conductivity type impurity is introduced into the second surface by diffusion; and
the masking layer prevents the impurity from diffusing into the first surface.

10. A method as in claim 1 including the subsequent step of introducing a second conductivity type impurity of opposite conductivity to the first conductivity type into each region of epitaxial material.

11. A method as in claim 1 wherein the step of removing epitaxial material is accomplished by:
forming a mask over those portions of the epitaxial material overlying the second surface; and
etching the epitaxial material which is not overlaid by the mask.

12. A method as in claim 11 wherein:
the mask is silicon nitride; and
the epitaxial material is silicon.

13. A method as in claim 1 wherein:
the substrate is silicon; and
the step of forming regions of insulating material is accomplished by thermal oxidation of the substrate.

* * * * *